US012618989B2

(12) United States Patent
Nenonen et al.

(10) Patent No.: US 12,618,989 B2
(45) Date of Patent: May 5, 2026

(54) SEMICONDUCTOR RADIATION DETECTOR ASSEMBLY

(71) Applicant: OXFORD INSTRUMENTS TECHNOLOGIES OY, Espoo (FI)

(72) Inventors: Seppo Nenonen, Espoo (FI); Hans Andersson, Vantaa (FI)

(73) Assignee: OXFORD INSTRUMENTS TECHNOLOGIES OY, Espoo (FI)

( * ) Notice: Subject to any disclaimer, the term of this patent is extended or adjusted under 35 U.S.C. 154(b) by 421 days.

(21) Appl. No.: 18/321,200

(22) Filed: May 22, 2023

(65) Prior Publication Data

US 2023/0408713 A1      Dec. 21, 2023

(30) Foreign Application Priority Data

May 23, 2022      (FI) ...................................... 20225452

(51) Int. Cl.
G01T 1/24          (2006.01)
H10F 30/00        (2025.01)
(Continued)

(52) U.S. Cl.
CPC ........... G01T 1/244 (2013.01); H10F 30/301 (2025.01); H10F 77/60 (2025.01); H10N 10/80 (2023.02)

(58) Field of Classification Search
CPC ....... G01T 1/244; H10F 77/60; H10F 30/301; H10N 10/80
See application file for complete search history.

(56) References Cited

U.S. PATENT DOCUMENTS 5,552,609 A * 9/1996 Katagiri .................. G01T 1/244
250/370.15
5,886,341 A 3/1999 Tateishi et al.
(Continued)

FOREIGN PATENT DOCUMENTS

JP          2003258221 A      9/2003
JP          2005051079 A      2/2005

OTHER PUBLICATIONS

Finland Search Report for FI20225452 dated Dec. 7, 2022, 2 pages.
(Continued)

*Primary Examiner* — Hugh Maupin
(74) *Attorney, Agent, or Firm* — NIXON & VANDERHYE

(57)          ABSTRACT

Disclosed is a header for a radiation detector assembly provided for mounting a detector head into an enclosure formed by the header and a detector can to form the radiation detector assembly. The detector head includes a semiconductor radiation detector arranged on a first side of a substrate and a thermoelectric cooler, TEC, arranged on a second side of the substrate, the header including: a base plate having a first side for mounting the TEC and a second side with an attachment mechanism for attaching the radiation detector assembly to a radiation-detecting appliance; contact pins that provide electrical coupling through the base plate protruding from the first side of the base plate to substantially define a rim for accommodating the TEC within the rim; and a draining outlet with an opening through the base plate between its first and second sides transferring a gas to and/or from the enclosure.

15 Claims, 3 Drawing Sheets

(51) Int. Cl.
    *H10F 77/60*        (2025.01)
    *H10N 10/80*      (2023.01)

(56)           References Cited

U.S. PATENT DOCUMENTS

| | | | |
|---|---|---|---|
| 5,959,301 A | | 9/1999 | Warashina |
| 5,970,720 A | * | 10/1999 | Katagiri .................... F25B 9/14 |
| | | | 62/51.1 |
| 6,472,664 B1 | | 10/2002 | Kyushima et al. |
| 2004/0200286 A1 | | 10/2004 | Mast |
| 2014/0346630 A1 | * | 11/2014 | Kamarainen ........... H10F 77/60 |
| | | | 257/459 |
| 2015/0162455 A1 | * | 6/2015 | Kamarainen ............. G01J 1/44 |
| | | | 257/459 |
| 2015/0187551 A1 | | 7/2015 | Ishizu et al. |
| 2019/0363204 A1 | | 11/2019 | Andersson |

OTHER PUBLICATIONS

Office Action, issued in Finnish Patent Application No. 20225452 dated Mar. 25, 2024.

\* cited by examiner

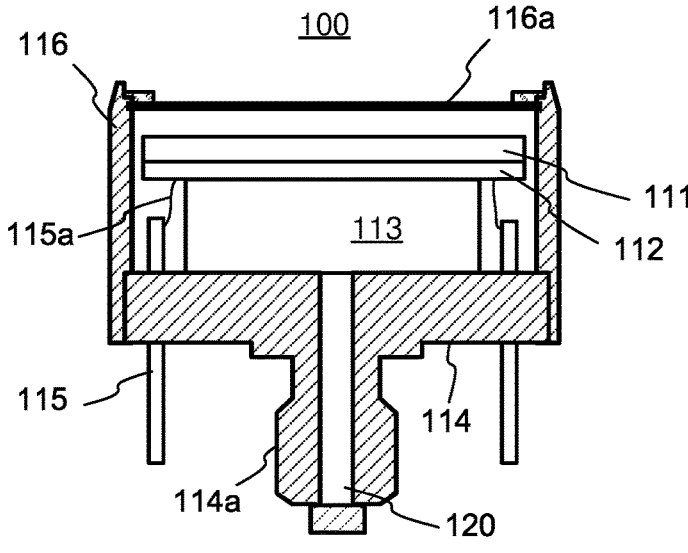
Figure 1
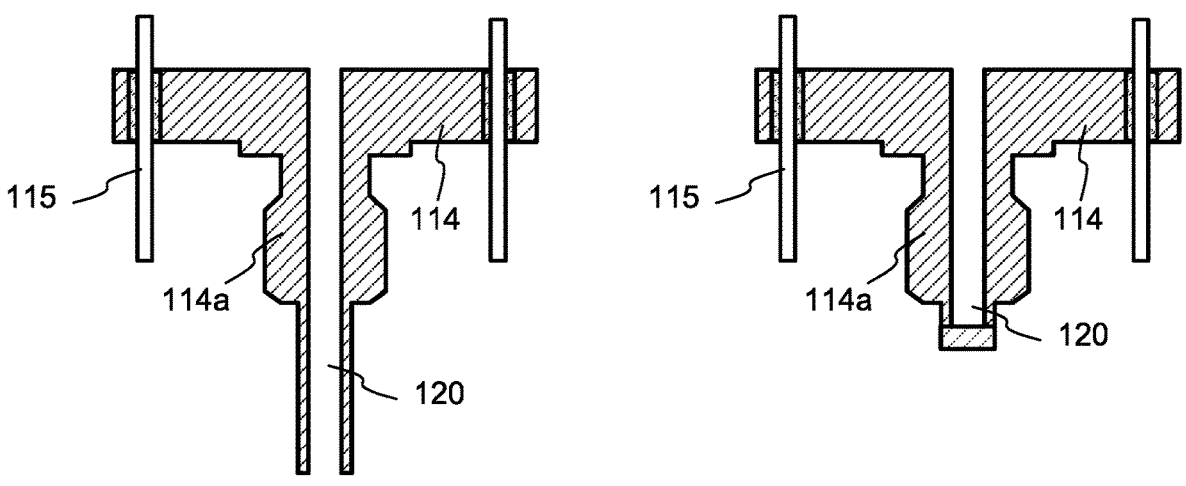
Figure 2A                    Figure 2B

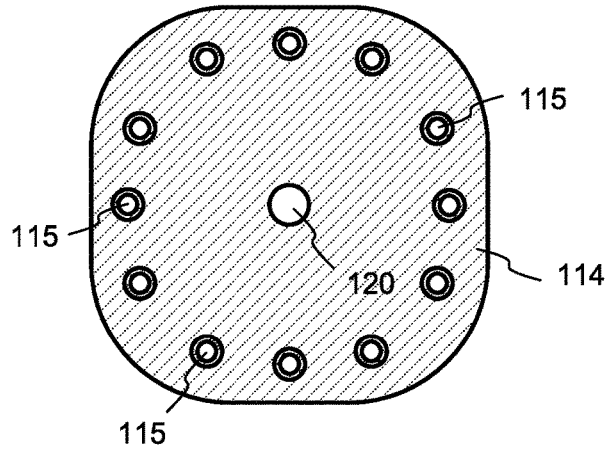
Figure 2C
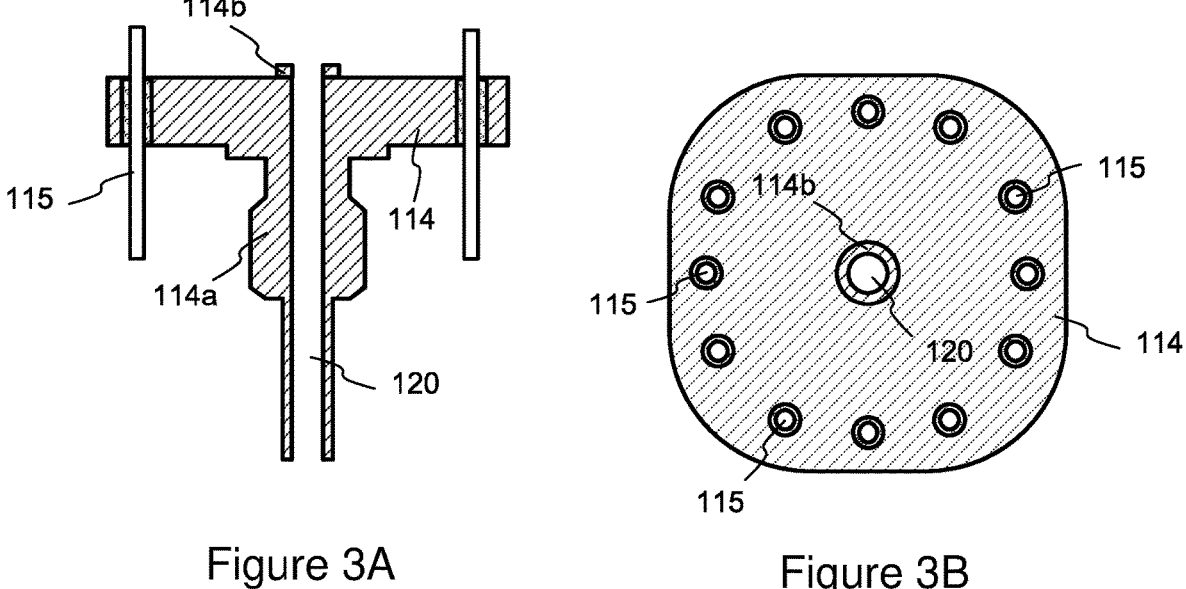
Figure 3A
Figure 3B

Figure 4:
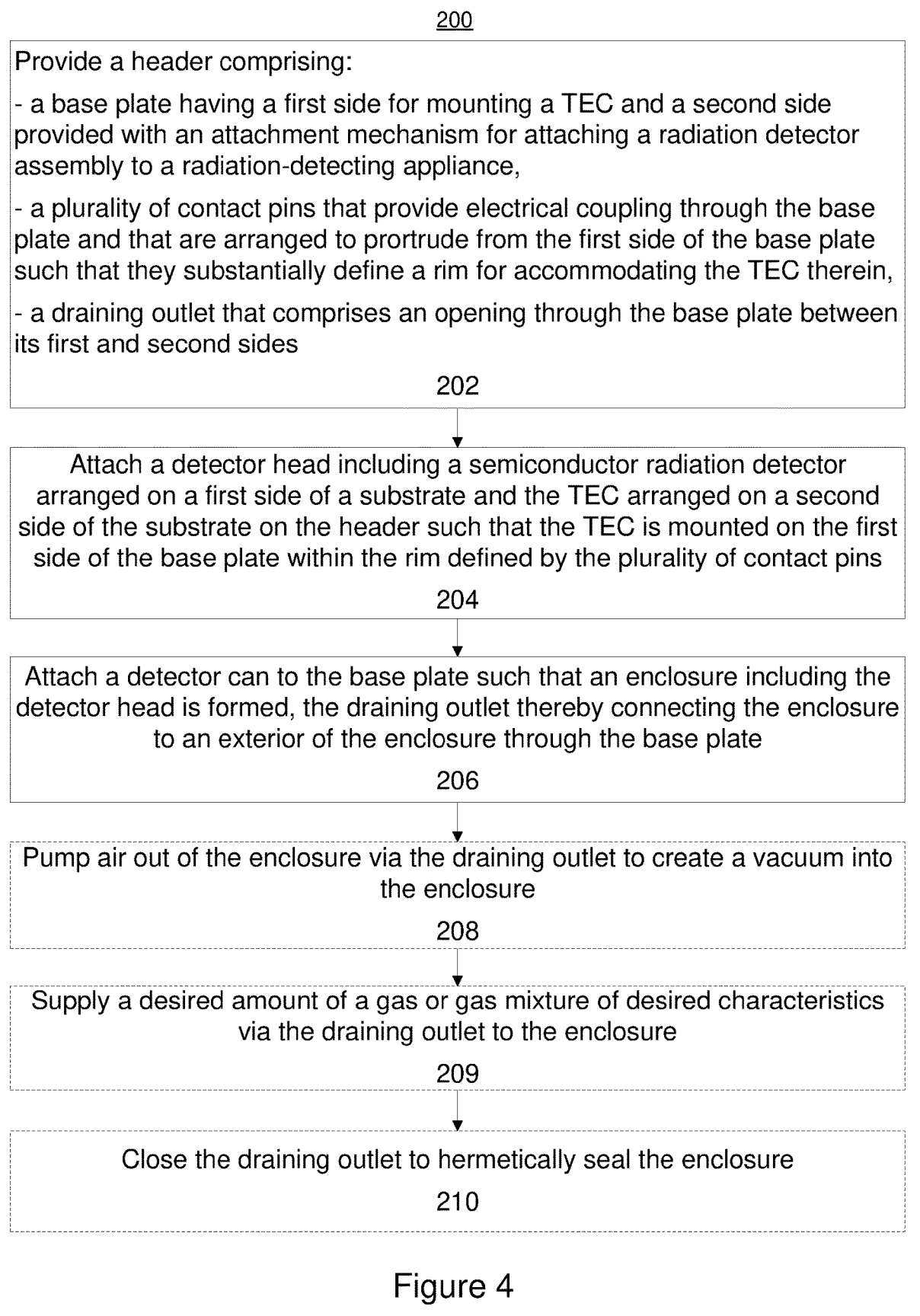

200

Provide a header comprising:

- a base plate having a first side for mounting a TEC and a second side provided with an attachment mechanism for attaching a radiation detector assembly to a radiation-detecting appliance,

- a plurality of contact pins that provide electrical coupling through the base plate and that are arranged to prortrude from the first side of the base plate such that they substantially define a rim for accommodating the TEC therein,

- a draining outlet that comprises an opening through the base plate between its first and second sides

202

Attach a detector head including a semiconductor radiation detector arranged on a first side of a substrate and the TEC arranged on a second side of the substrate on the header such that the TEC is mounted on the first side of the base plate within the rim defined by the plurality of contact pins

204

Attach a detector can to the base plate such that an enclosure including the detector head is formed, the draining outlet thereby connecting the enclosure to an exterior of the enclosure through the base plate

206

Pump air out of the enclosure via the draining outlet to create a vacuum into the enclosure

208

Supply a desired amount of a gas or gas mixture of desired characteristics via the draining outlet to the enclosure

209

Close the draining outlet to hermetically seal the enclosure

SEMICONDUCTOR RADIATION DETECTOR ASSEMBLY

CROSS REFERENCE TO RELATED APPLICATION

This application claims the priority under 35 USC 119(a) of Finnish patent application 20225452 filed on May 23, 2022, the entirety of which is incorporated herein by reference.

BACKGROUND OF THE INVENTION

Field of the Invention

The present invention relates to a semiconductor radiation detector assembly.

Description of the Related Art

A semiconductor radiation detector may be applied as a component for detecting radiation (ionizing radiation or non-ionizing radiation), such as gamma rays, X-rays, ultra-violet (UV) radiation, visible radiation or charged particle radiation, e.g. in an analyzer device, in a spectrometer or in an electron microscope. A semiconductor radiation detector typically operates to output an electrical measurement signal that is descriptive of the detected level of incident radiation.

Non-limiting examples of semiconductor radiation detectors include a semiconductor drift detector (SDD) and a PIN diode that each include a collector electrode arranged on one surface of a semiconductor block and a field electrode arrangement arranged on at least on an opposite surface of the semiconductor block to create an electric field for driving signal charges (e.g. electrons) generated in the semiconductor block due to incident radiation to the collector electrode such that the measurement signal can be read out from the collector electrode.

For practical applications, the semiconductor radiation detector is typically provided as a part of a detector head that may include the semiconductor radiation detector attached on one side of a substrate that provides electrical connections for supplying the measurement signal generated in the semiconductor radiation detector to a radiation-detecting appliance. The detector head typically also includes a thermo-electric cooler (TEC) attached on the other side of the substrate. The detector head may be coupled to the radiation-detecting appliance via a so-called header, whereas an arrangement of the detector head and the header may be referred to as a radiation detector assembly.

The header may include a base plate provided with a plurality of contact pins that go through holes arranged in the base plate, whereas the detector head may be mounted on the base plate such that the TEC is surrounded by the contact pins that may be electrically coupled to the semiconductor radiation detector (via the substrate) to enable electrical connection(s) between the semiconductor radiation detector and the radiation-detecting appliance. The header may further include an attachment mechanism for mounting the radiation detector assembly to the radiation-detecting appliance. The detector head may be covered by a detector can arranged on the base plate such that the base plate and the detector can provide a hermetically sealed enclosure around the detector head. In this regard, a front face of the detector can may be provided with an opening covered by a radiation window to enable the incoming radiation to enter the enclosure and meet the radiation-detecting surface of the semiconductor radiation therein.

Typically, in order to ensure reliable and undisturbed detection of incident radiation by operation of the semiconductor radiation detector in such a radiation detector assembly, the hermetically sealed enclosure inside the detector can is filled with a certain gas or gas mixture or a vacuum is created therein. Filling the enclosure with the certain gas or gas mixture or creating a vacuum therein (e.g. via usage of a vacuum pump) when attaching the detector can to the base plate upon construction of the radiation detector assembly is a non-trivial procedure that is prone to errors and in many occasions leads into compromised results and hence approaches that facilitate filling the enclosure with the gas or gas mixture of desired characteristics or creation of a vacuum into the enclosure in a reliable manner would be highly desirable.

SUMMARY OF THE INVENTION

It is therefore an object of the present invention to provide a radiation detector assembly having a structure that facilitates filling the hermetically sealed enclosure between the detector can and the base plate of the header with a gas or gas mixture of desired characteristics or creating a vacuum into the enclosure in a reliable and straightforward manner.

According to an example embodiment, a header for a radiation detector assembly is provided, wherein the header is provided for mounting a detector head into an enclosure formed by the header and a detector can to form a radiation detector assembly, wherein the detector head comprises a semiconductor radiation detector arranged on a first side of a substrate and a thermoelectric cooler (TEC) arranged on a second side of the substrate, the header comprising: a base plate having a first side for mounting the TEC and a second side provided with an attachment mechanism for attaching the radiation detector assembly to a radiation-detecting appliance; a plurality of contact pins that provide electrical coupling through the base plate arranged to protrude from the first side of the base plate such that they substantially define a rim for accommodating the TEC within the rim; and a draining outlet that comprises an opening through the base plate between its first and second sides for transferring a gaseous substance to and/or from the enclosure.

According to an example embodiment, a radiation detector assembly is provided, the radiation detector assembly comprising: a header according to the example embodiment described in the foregoing; a detector head including a semiconductor radiation detector arranged on a first side of a substrate and a thermoelectric cooler (TEC) arranged on a second side of the substrate, the detector head arranged on the header such that the TEC is mounted on the first side of the base plate within the rim defined by the plurality of contact pins; and a detector can attached to the base plate such that an enclosure including the detector head is formed, the draining outlet thereby connecting said enclosure to an exterior of the enclosure through the base plate for transferring a gaseous substance to and/or from the enclosure.

According to an example embodiment, a method for constructing a radiation detector assembly is provided, the method comprising: providing a header comprising: a base plate having a first side for mounting a thermoelectric cooler (TEC) of a detector head and a second side provided with an attachment mechanism for attaching the radiation detector assembly to a radiation-detecting appliance, a plurality of contact pins that provide electrical coupling through the base plate and that are arranged to protrude from the first side of the base plate such that they substantially define a rim for accommodating the TEC within the rim, and a draining outlet that comprises an opening through the base plate between its first and second sides; attaching the detector head including a semiconductor radiation detector arranged on a first side of a substrate and the TEC arranged on a second side of the substrate on the header such that the TEC is mounted on the first side of the base plate within the rim defined by the plurality of contact pins; and attaching a detector can to the base plate such that an enclosure including the detector head is formed, the draining outlet thereby connecting said enclosure to an exterior of the enclosure through the base plate for transferring a gaseous substance to and/or from the enclosure.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

The verbs "to comprise" and "to include" are used in this document as open limitations that neither exclude nor require the existence of also un-recited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE DRAWINGS

The embodiments of the invention are illustrated by way of example, and not by way of limitation, in the figures of the accompanying drawings, where:

FIG. 1 schematically illustrates a cross-section of some components of a radiation detector assembly according to an example;

FIG. 2A schematically illustrates a cross-section of some components of a header according to an example;

FIG. 2B schematically illustrates a cross-section of some components of a header according to an example;

FIG. 2C schematically illustrates some components of a header according to an example;

FIG. 3A schematically illustrates a cross-section of some components of a header according to an example;

FIG. 3B schematically illustrates some components of a header according to an example; and FIG. 4 illustrates a method according to an example.

DETAILED DESCRIPTION

FIG. 1 schematically illustrates a cross-section of some components of a radiation detector assembly 100 according to an example, where the radiation detector assembly 100 comprises a detector head mounted on a header according to an example. In this regard, it should be noted that the schematic illustration of FIG. 1 is a simplified one for improved graphical clarity and it omits possible intermediate shielding layers and other components or features that are not essential for understanding various advantageous features of the present invention. In the example of FIG. 1, components of the detector head include a radiation detector 111, a substrate 112 and a thermo-electric cooler (TEC) 113, whereas components of the header include a base plate 114 and a plurality of contact pins 115 (while the schematic cross-section of the radiation detector assembly shows only two of the plurality of contact pins 115).

In the detector head, the radiation detector 111 may comprise a semiconductor radiation detector such as a silicon drift detector (SDD) or a PIN diode that is arranged to provide an (electrical) measurement signal that is descriptive of the detected level of incident radiation received at its radiation-detecting surface. The radiation detector 111 may be attached on one (first) side of the substrate 112, whereas the opposite (second) side of the substrate 112 may be attached to the TEC 113. As a non-limiting example, the substrate 112 may comprise a ceramic substrate, whereas the TEC 113 may be also referred to as a Peltier device. The substrate 112 may provide electrical connections between the radiation detector 111 and one or more components electrically coupled to the radiation detector assembly. The TEC 113 may serve for cooling the radiation detector 111 in order to reduce leakage currents that may otherwise arise in the radiation detector 111 as well as to reduce other sources of noise. Moreover, the TEC 113 may be also employed to stabilize the operating temperature of the radiation detector 111 to ensure stable measurement results irrespective of ambient temperature.

In the header, the base plate 114 may have a first side intended for mounting the detector head on the header such that the TEC 113 is arranged against the first side of the base plate 114. The first side may be substantially planar (as in the schematic example of FIG. 1) or it may comprise a substantially planar portion for interfacing a substantially planar surface of the TEC 113. In the example of FIG. 1 the other (second) side of the base plate 114 is provided with an attachment bolt 114a protruding to a direction that is opposite to the first side of the base plate 114 and hence to a direction that is opposite to the detector-head-facing (first) side of the base plate 114 when the detector head is mounted on the first side of the base plate 114. The attachment bolt 114a may be applicable for attaching the radiation detector assembly 100 to a radiation-detecting appliance. In an example, the attachment bolt 114a protruding from the second side of the base plate 114 may have a threaded side surface that enables mounting the radiation detector assembly 100 to a matching thread provided on an inner surface of a recess provided in the radiation-detecting appliance. In other examples, the second side of the base plate 114 may be provided with an attachment mechanism different from the attachment bolt 114a. Typically, the base plate 114 and the attachment mechanism (e.g. the attachment bolt 114a) included therein are provided as a single-piece element that may be also referred to as a base member or as a base assembly. The base plate 114 or the base member in its entirety may be made of metal (such as copper, nickel, iron, aluminum, copper-tungsten alloy, nickel-cobalt ferrous alloy (e.g. Kovar®), stainless steel, etc.) or another material that is relatively effective in conducting heat transferred from the radiation detector 111 and the TEC 113.

The contract pins 115 may go through respective holes arranged in the base plate 114 such that they protrude from the first side of the base plate 114 towards the direction of the detector head. In this regard, the plurality of contact pins 115 may be arranged to define a rim that has shape and size suitable for accommodating the TEC 113 within the rim. The rim may be also referred to as a ring and it may define an outline that has e.g. a circular, a rectangular or an arbitrary shape that enables accommodating the TEC 113 therein. The contact pins 115 may be electrically isolated from the base plate 114 by respective insulator sleeves that (together with the contact pins 115 arranged therein) may also contribute to hermetically sealing the respective holes through the base plate 114. At least some of the contact pins 115 may be electrically coupled to the radiation detector 111 via the electrical connections provided in the substrate 112 to enable electrical connections between the radiation detector 111 and one or more elements of the radiation-detecting appliance, e.g. to enable provision of the measurement signal from the radiation detector 111 to the radiation-detecting appliance via the contact pins 115. As a non-limiting example in this regard, the illustration of FIG. 1 shows the electrical coupling between the contact pins 115 and the substrate 112 provided via respective bonding wires 115a.

The radiation detector assembly 100 may further comprise a detector can 116 arranged to cover the detector head mounted on the base plate 114 of the header. In this regard, the detector can 116 may be attached to the base plate 114 such that the base plate 114 and the detector can 116 provide a hermetically sealed enclosure around the detector head. The attachment between the base plate 114 and the detector can 116 may be provided using e.g. a suitable technique known in the art, such as welding, brazing, soldering or adhesive bonding. A front face of the detector can 116 may have an opening covered by a radiation window 116a to enable the incoming radiation to enter the enclosure and meet the radiation-detecting surface of the radiation detector 111 inside the enclosure.

The example of FIG. 1 further illustrates a draining outlet 120 that comprises an opening that leads from the first side of the base plate 114 to the second side of the base plate 114 through the base plate 114. In the example illustrated in FIG. 1 the draining outlet 120 is routed through the base plate 114 via the attachment bolt 114a, whereas in other examples the draining outlet 120 may be routed through another portion of the base plate 114. The draining outlet 120 may be applicable for transferring a gaseous substance from the enclosure and to the enclosure, thereby enabling pumping the air (or other gas) out of the enclosure and/or supplying a desired gas or gas mixture into the enclosure. Consequently, the draining outlet 120 may be applied for pumping the air out of the enclosure in order to create a vacuum inside the enclosure, possibly followed by filling the enclosure with a desired amount of a desired gas or gas mixture, after which the enclosure may be hermetically sealed (as schematically shown in the illustration of FIG. 1). This serves to ensure reliable and undisturbed detection of incident radiation by operation of the radiation detector 111, whereas a vacuum within the enclosure may contribute towards improved efficiency of cooling of the radiation detector 111 via operation of the TEC 113.

FIGS. 2A, 2B and 2C schematically illustrate the header separately from other components of the radiation detector assembly 100 according to an example, where FIGS. 2A and 2B schematically illustrate a cross-section of some components of the header, whereas FIG. 2C provides a schematic view to the first side of the base plate 114 according to an example. In this regard, FIG. 2A shows the header before closing the draining outlet 120, whereas FIG. 2B shows the header after closing the draining outlet 120. In the example of FIGS. 2A, 2B and 2C the draining outlet 120 is provided as an opening through a central portion of the base plate 114 and through the attachment bolt 114a. As illustrated in FIGS. 2A and 2B, the draining outlet 120 may further comprise a tube section that protrudes from attachment bolt 114a (FIG. 2A), whereas the tube section may be closed to hermetically seal the enclosure (after creation of the vacuum in the enclosure, possibly followed by filing the enclosure with the desired amount of the desired gas or gas mixture) and cut to a desired length (FIG. 2B). Assuming that the base plate 114 is made of metal such as copper, nickel, iron, aluminum, etc., the aspect of closing the tube section may comprise 'pinching' the tube section via applying a sufficient pressure to a desired position of the tube section to seal the enclosure and cutting off the unnecessary portion of the tube section.

Still referring to the example of FIGS. 2A, 2B and 2C, a portion of the TEC 113 intended for placement against the first side of the base plate 114 may be provided with an opening that is to be aligned with (e.g. centered with respect to) the opening of the draining outlet 120 when the TEC 113 is arranged on the first side of the base plate 114, thereby facilitating undisturbed flow of air or other gas between the enclosure and the draining outlet 120. As an example in this regard, as known in the art, the TEC 113 may comprise a stack of plates where adjacent (ceramic) plates are coupled to each other via alternating semiconductor pillars of p-type and n-type that are electrically coupled in series and that are placed thermally in parallel to each other, where the (ceramic) plate intended for facing the first side of the base plate 114 may be provided with the opening that allows for flow of air or other gas to and from the draining outlet 120.

FIGS. 3A and 3B schematically illustrate the header separately from other components of the radiation detector assembly 100 according to another example, where FIG. 3A schematically illustrates a cross-section of some components of the header before closing the draining outlet 120 and FIG. 3B provides a schematic view to the first side of the base plate 114. The header according to the example of FIGS. 3A and 3B is similar to that of the example of FIGS. 2A, 2B and 2C with the exception that the first side of the base plate 114 is provided with a rim section 114b that protrudes from the first side of the base plate 114 and surrounds the opening through the base plate 114 such that it serves as part of the draining outlet 120. Conversely, the opening in the portion of the TEC 113 intended for placement against the first side of the base plate 114 may have a shape and size that substantially match a shape and size of the rim section 114b, thereby facilitating mounting of the detector head on the header via aligning the opening in the TEC 113 with the protrusion formed by the rim section 114b on the first side of the base plate 114. Moreover, the rim section 114b may further facilitate avoiding e.g. glue or solder applied to attach the TEC 113 on the first side of the base plate 114 inadvertently getting into the draining outlet 120.

The header described in the foregoing via references to examples of FIGS. 1 to 3B may be applied in constructing the radiation detector assembly 100, for example, according to a method 200 illustrated in FIG. 4. The method 200 may comprise the following steps:

providing a header that comprises the base plate 114 that has a first side for mounting the TEC 113 of the detector head and a second side provided with the attachment mechanism (such as the attachment bolt 114a) for attaching the radiation detector assembly 100 to the radiation-detecting appliance, the plurality of contact pins 115 that provide electrical coupling through the base plate 114 and that are arranged to protrude from the first side of the base plate 114 such that they substantially define a rim for accommodating the TEC 113 therein, and the draining outlet 120 that comprises an opening through the base plate 114 between its first and second sides (block 202);

attaching the detector head that includes the radiation detector 111 arranged on a first side of the substrate 112 and the TEC 113 arranged on the second side of the substrate 112 on the header such that the TEC 113 is mounted on the first side of the base plate 114 within the rim defined by the plurality of contact pins 115 (block 204); and attaching the detector can 116 to the base plate 114 such that the enclosure including the detector head is formed, the draining outlet 120 thereby connecting the enclosure to an exterior of the enclosure through the base plate 114 for transferring a gaseous substance to and/or from the enclosure (block 206).

Hence, respective operations pertaining to blocks 202 to 206 enable constructing the radiation detector assembly 100 where the detector head is disposed within the enclosure formed by the base plate 114 and the detector can 116 attached thereto but where the enclosure still includes ambient air. Such an approach avoids the need to create the vacuum inside the enclosure while attaching the detector can 116 to the base plate 114, thereby streamlining the process of arranging the detector head, the header and the detector can 116 into the radiation detector assembly 100. The radiation detector assembly 100 resulting from operations according to blocks 202 to 206 may be further subjected to the following operations:

pumping air out of the enclosure via the draining outlet 120 to create a vacuum into the enclosure (block 208);

optionally, supplying a desired amount of a gas or gas mixture of desired characteristics via the draining outlet 120 to the enclosure (block 209); and closing the draining outlet 120 to hermetically seal the enclosure (block 210).

Consequently, a procedure that involves respective operations pertaining to blocks 208 and 210 (without the optional step of block 209) enables creating and securing the vacuum within the enclosure formed between the base plate 114 and the detector can 116 after having constructed the radiation detector assembly 100 via respective operations pertaining to blocks 202 to 206. Such approach allows for creating and securing the vacuum in a reliable manner using a relatively straightforward procedure. Along similar lines, a procedure that involves respective operations pertaining to blocks 208, 209 and 210 enables filling the enclosure with the desired amount of the gas or gas mixture of desired kind in a controlled manner after having constructed the radiation detector assembly 100 via respective operations pertaining to blocks 202 to 206.

In particular, the method 200 enables attaching the detector head, the header and the detector can 116 to each other to construct the radiation detector assembly 100 before creating the vacuum into the enclosure formed by the base plate 114 and the detector can 116 and subsequently making use of the draining outlet 120 to create the vacuum inside the enclosure, possibly followed by supplying the desired amount of the gas or gas mixture of desired kind, before hermetically sealing the enclosure via closing the draining outlet 120.

Referring back to operations that pertain to block 202, according to an example, the aspect of providing the base plate 114 may include the following sub-steps:

machining a piece of metal (such as such as copper, nickel, iron, aluminum, etc.) into the base plate 114 having a first side for mounting the TEC 113 thereon, having the attachment mechanism (e.g. the attachment bolt 114*a*) protruding from a second side, and having the draining outlet 120 that comprises an opening through the base plate 114 between its first and second sides, machining the base plate 114 to include the plurality of openings therethrough in respective positions to enable installing the plurality of contact pins 115 therein such that they define the rim for accommodating the TEC 113 within the rim, and fitting the plurality of contact pins 115 into respective ones of the plurality of holes through the base plate 114 via respective insulator sleeves.

In the procedure described above, machining the piece of metal into the base plate 114 and machining the base plate 114 to include the plurality of holes therethrough may comprise usage of various techniques, such as one or more of the following: laser cutting, water jet cutting, etching, computer numerical control (CNC) milling, brazing, welding.

Referring back to operations that pertain to block 204, according to an example, the aspect of attaching the TEC 113 to the first side of the base plate 114 may comprise gluing (the lowermost plate of) the TEC 113 to the first side of the base plate 114. In other examples, techniques other than gluing, such as soldering or mechanical clamping, may be applied in attaching these two elements to each other.

Referring back to operations that pertain to block 206, according to an example, the aspect of attaching the detector can 116 to the base plate 114 to form the detector-head-including enclosure may comprise a suitable welding technique known in the art, such as seam sealing, laser welding or projection welding. In other examples, techniques such as brazing, soldering or gluing may be applied for attaching the detector can 116 to the base plate 114 instead of welding.

Referring back to operations that pertain to block 210, according to an example, the aspect of closing the draining outlet 120 in order to secure keeping the vacuum or the desired amount of the gas or gas mixture within the enclosure may comprise closing the tube section of the draining outlet 120 in a desired position, thereby sealing the enclosure. The operations of block 210 may further comprise cutting off a portion of the tube section that is further away from the base plate 114 than the desired position, thereby dispensing with a portion of the tube section that becomes redundant after sealing the enclosure. Assuming a scenario where the base plate 114 and the tube section therein is made of metal, the aspect of closing the draining outlet 120 may comprise 'pinching' the tube section via applying a sufficient pressure to the desired position of the tube section to seal the enclosure. Cutting off the unnecessary portion of the tube section minimizes the sizes of any protrusions on the second side of base plate 114, thereby providing a space-saving approach. In this regard, routing the draining outlet 120 through the attachment mechanism (such as the attachment bolt 114*a*) enables avoiding any additional protrusions on the second side of the base plate 114, which may facilitate integration of the radiation detector assembly 100 to radiation-detecting appliances of various types and sizes.

In the examples provided in the foregoing, the tube section that form part of the draining outlet 120 is described as an integral part of the base plate 114 that, implicitly, forms an integral part of the base plate 114 that may be formed e.g. upon machining the piece of metal into the base plate, thereby implying that the tube section is made of the same material as a body of the base plate 114. In another example, the tube section may be prepared separately from the body of the base plate 114 and it may be attached to the body of the base plate 114 as part of constructing the base plate 114 e.g. via brazing, soldering or gluing or via using a suitable welding technique known in the art. In an example, the tube section may be made of the same material as the body of the base plate 114, whereas in another example the tube section may be made of a material that is different from the material used for the body of the base plate 114. In the latter example, applicable materials for the tube section include the ones that are considered suitable for the base plate 114, e.g. copper, nickel, iron, aluminum, copper-tungsten alloy, nickel-cobalt ferrous alloy (e.g. Kovar®), stainless steel, etc.

In the examples provided in the foregoing, the opening through the base plate 114 that serves as part of the draining outlet 120 is routed through the attachment mechanism (e.g. the attachment bolt 114*a*) and the tube section is formed (or attached) to the attachment mechanism such that it forms part of the draining outlet 120. In another example, the opening through the base plate 114 may be routed through another portion of the base plate 114, e.g. in a portion of the base plate 114 between the attachment mechanism and the rim formed by the plurality of contact pins 115 or in a portion of the base plate 114 between an outer perimeter (e.g. an edge) of the base plate 114 the rim formed by the plurality of contact pins 115. Consequently, the tube section may be formed (or attached) to the respective portion of the base plate 114 so as to provide the draining outlet 120 together with the opening through the base plate 114.

The invention claimed is:

1. A header for mounting a detector head into an enclosure formed by the header and a detector can to form a radiation detector assembly, the detector head including a semiconductor radiation detector disposed on a first side of a substrate and a thermoelectric cooler (TEC), disposed on a second side of the substrate, the header comprising:

a base plate having a first side to mount the TEC and a second side provided with an attachment mechanism configured to attach the radiation detector assembly to a radiation-detecting appliance;

a plurality of contact pins that provide electrical coupling through the base plate configured to protrude from the first side of the base plate such that the contact pins substantially define a rim configured to accommodate the TEC within the rim; and a draining outlet comprising an opening through the base plate between first and second sides thereof to transfer a gaseous substance to and/or from the enclosure, the opening through the base plate being routed through the attachment mechanism.

2. The header according to claim 1, wherein the attachment mechanism comprises an attachment bolt.

3. The header according to claim 2, wherein the draining outlet further comprises a tube section protruding from the attachment mechanism.

4. The header according to claim 1, wherein the base plate comprises a rim section that protrudes from the first side of the base plate and surrounds the opening through the base plate such that is serves as part of the draining outlet, thereby facilitating positioning of the TEC having a recess that has a shape and a size substantially matching a shape and a size of the rim section in its surface configured to face the first side of the base plate.

5. The header according to claim 1, wherein
the base plate comprises a plurality of holes therethrough, and
the plurality of contact pins are fitted into respective ones of the plurality of holes through the base plate via respective insulator sleeves.

6. A radiation detector assembly comprising:
the header according to claim 1;
a detector head including a semiconductor radiation detector disposed on a first side of a substrate and a thermoelectric cooler disposed on a second side of the substrate, the detector head disposed on the header such that the TEC is mounted on the first side of the base plate within the rim defined by the plurality of contact pins; and a detector attached to the base plate such that an enclosure including the detector head is formed, the draining outlet thereby connecting said enclosure to an exterior of the enclosure through the base plate to transfer a gaseous substance to and/or from the enclosure.

7. A method for constructing a radiation detector assembly, the method comprising:

providing a header comprising:

a base plate having a first side configured to mount a thermoelectric cooler (TEC) of a detector head and a second side provided with an attachment mechanism configured to attach the radiation detector assembly to a radiation-detecting appliance, a plurality of contact pins that provide electrical coupling through the base plate and that are configured to protrude from the first side of the base plate such that the contact pins substantially define a rim to accommodate the TEC within the rim, and a draining outlet comprising an opening through the base plate between the first and second sides thereof;

attaching the detector head including a semiconductor radiation detector disposed on a first side of a substrate and the TEC disposed on a second side of the substrate on the header such that the TEC is mounted on the first side of the base plate within the rim defined by the plurality of contact pins; and attaching a detector can to the base plate such that an enclosure including the detector head is formed, the draining outlet thereby connecting said enclosure to an exterior of the enclosure through the base plate to transfer a gaseous substance to and/or from the enclosure.

8. The method according to claim 7,
wherein a surface of the TEC configured to face the first side of the base plate comprises an opening, and
wherein attaching the detector head on the header comprises aligning said opening in the surface of the TEC with the opening through the base plate.

9. The method according to claim 8,
wherein the base plate comprises a rim section that protrudes from the first side of the base plate and surrounds the opening through the base plate such that the rim section serves as part of the draining outlet,
wherein said opening in the surface of the TEC configured to face the first side of the base plate has a shape and a size substantially matching a shape and a size of the rim section, and
wherein attaching the detector head on the header comprises aligning said recess with said rim section.

10. The method according to claim 7, wherein the attachment mechanism comprises an attachment bolt.

11. The method according to claim 7, wherein the draining outlet further comprises a tube section protruding from the attachment mechanism.

12. The method according to claim 7, further comprising:
pumping air out of said enclosure via the draining outlet to create a vacuum into the enclosure; and
closing the draining outlet to hermetically seal the enclosure.

13. The method according to claim 11, further comprising:

pumping air out of said enclosure via the draining outlet to create a vacuum into the enclosure;

closing the tube section of the draining outlet in a desired position to hermetically seal the enclosure; and cutting off a portion of the tube section that is further away from the base plate than the desired position.

14. The method according to claim 12, further comprising supplying, after having created the vacuum into the enclosure, a desired amount of gas or gas mixture of desired characteristics via the draining outlet to the enclosure.

15. The method according to claim 13, further comprising supplying, after having created the vacuum into the enclosure, a desired amount of gas or gas mixture of desired characteristics via the draining outlet to the enclosure.

\* \* \* \* \*